(12) United States Patent
Fest et al.

(10) Patent No.: US 9,917,251 B2
(45) Date of Patent: Mar. 13, 2018

(54) RESISTIVE MEMORY CELL HAVING A REDUCED CONDUCTIVE PATH AREA

(71) Applicant: Microchip Technology Incorporated, Chandler, AZ (US)

(72) Inventors: Paul Fest, Chandler, AZ (US); James Walls, Mesa, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 15/065,354

(22) Filed: Mar. 9, 2016

(65) Prior Publication Data

US 2016/0190442 A1    Jun. 30, 2016

Related U.S. Application Data

(62) Division of application No. 14/184,268, filed on Feb. 19, 2014, now Pat. No. 9,318,702.

(51) Int. Cl.
*H01L 45/00* (2006.01)
*H01L 27/24* (2006.01)

(52) U.S. Cl.
CPC ...... *H01L 45/1273* (2013.01); *H01L 27/2463* (2013.01); *H01L 45/08* (2013.01);
(Continued)

(58) Field of Classification Search
CPC . H01L 45/16; H01L 45/1666; H01L 45/1675; H01L 45/124; H01L 45/1273
See application file for complete search history.

(56) References Cited

U.S. PATENT DOCUMENTS

| | | | |
|---|---|---|---|
| 5,687,112 A | 11/1997 | Ovshinsky | 365/163 |
| 5,790,455 A | 8/1998 | Caywood | 635/185.06 |

(Continued)

FOREIGN PATENT DOCUMENTS

| | | | |
|---|---|---|---|
| CN | 101794860 A | 8/2010 | G11C 11/21 |
| CN | 102130145 A | 7/2011 | H01L 27/24 |

(Continued)

OTHER PUBLICATIONS

U.S. Non-Final Office Action, U.S. Appl. No. 14/184,034, 20 pages, dated Jul. 5, 2016.
(Continued)

*Primary Examiner* — Laura Menz
*Assistant Examiner* — Candice Y Chan
(74) *Attorney, Agent, or Firm* — Slayden Grubert Beard PLLC (57) ABSTRACT

A method of forming a resistive memory cell, e.g., a CBRAM or ReRAM, may include forming a bottom electrode layer, oxidizing an exposed region of the bottom electrode layer to form an oxide region, removing a region of the bottom electrode layer proximate the oxide region, thereby forming a bottom electrode having a pointed tip region adjacent the oxide region, and forming an electrolyte region and top electrode over at least a portion of the bottom electrode and oxide region, such that the electrolyte region is arranged between the pointed tip region of the bottom electrode and the top electrode, and provides a path for conductive filament or vacancy chain formation from the pointed tip region of the bottom electrode to the top electrode when a voltage bias is applied to the memory cell. A memory cell and memory cell array formed by such method are also disclosed.

24 Claims, 8 Drawing Sheets

(52) U.S. Cl.
CPC .......... *H01L 45/085* (2013.01); *H01L 45/122*
(2013.01); *H01L 45/1233* (2013.01); *H01L*
*45/141* (2013.01); *H01L 45/146* (2013.01);
*H01L 45/16* (2013.01); *H01L 45/142*
(2013.01); *H01L 45/144* (2013.01); *H01L*
*45/145* (2013.01)

(56) References Cited

U.S. PATENT DOCUMENTS

| | | | | |
|---|---|---|---|---|
| 5,962,872 | A | 10/1999 | Zhang et al. | 257/66 |
| 5,986,931 | A | 11/1999 | Caywood | 365/185.06 |
| 6,031,287 | A | 2/2000 | Harshfield et al. | 257/734 |
| 6,147,395 | A | 11/2000 | Gilgen | 257/529 |
| 6,436,611 | B1 | 8/2002 | Lee | 430/314 |
| 9,269,606 | B2 | 2/2016 | Fest | |
| 9,281,476 | B2 | 3/2016 | Cai et al. | |
| 9,318,702 | B2 | 4/2016 | Fest et al. | |
| 9,349,950 | B2 | 5/2016 | Walls | |
| 9,362,496 | B2 | 6/2016 | Walls et al. | |
| 9,385,313 | B2 | 7/2016 | Fest et al. | |
| 9,412,942 | B2 | 8/2016 | Walls et al. | |
| 9,444,040 | B2 | 9/2016 | Sato et al. | |
| 2002/0036931 | A1 | 3/2002 | Lowrey et al. | 365/200 |
| 2002/0039306 | A1 | 4/2002 | Lowrey | 365/100 |
| 2004/0085833 | A1 | 5/2004 | Hwang et al. | 365/200 |
| 2004/0192009 | A1 | 9/2004 | Belyansky et al. | 438/424 |
| 2005/0029505 | A1 | 2/2005 | Lowrey | 257/5 |
| 2006/0006443 | A1 | 1/2006 | Lowrey et al. | 257/296 |
| 2006/0097238 | A1 | 5/2006 | Breuil et al. | 257/4 |
| 2006/0131556 | A1 | 6/2006 | Liu et al. | 257/5 |
| 2006/0131618 | A1 | 6/2006 | Hsueh | 257/246 |
| 2007/0097738 | A1 | 5/2007 | Asano et al. | 365/163 |
| 2007/0267618 | A1 | 11/2007 | Zaidi et al. | 257/2 |
| 2008/0012079 | A1 | 1/2008 | Zaidi | 257/379 |
| 2009/0017591 | A1 | 1/2009 | Cervin-lawry et al. | 438/384 |
| 2009/0026438 | A1 | 1/2009 | Lin | 257/4 |
| 2009/0096568 | A1 | 4/2009 | Hosoi et al. | 338/20 |
| 2009/0200640 | A1 | 8/2009 | Hosoi et al. | 257/536 |
| 2010/0019218 | A1 | 1/2010 | Chung | 257/4 |
| 2010/0038614 | A1 | 2/2010 | Hampton | 257/2 |
| 2010/0252798 | A1 | 2/2010 | Baker et al. | 206/503 |
| 2010/0055687 | A1 | 3/2010 | Sawyers et al. | 435/6.11 |
| 2010/0084741 | A1 | 4/2010 | Andres et al. | 257/536 |
| 2010/0163829 | A1 | 7/2010 | Wang et al. | 257/3 |
| 2010/0193762 | A1 | 8/2010 | Hsieh et al. | 257/4 |
| 2010/0264396 | A1 | 10/2010 | Lung et al. | 257/3 |
| 2011/0147694 | A1 | 6/2011 | Song et al. | 257/3 |
| 2011/0175048 | A1 | 7/2011 | Sekine et al. | 257/2 |
| 2011/0180775 | A1 | 7/2011 | Lin et al. | 257/4 |
| 2011/0291064 | A1 | 12/2011 | Marsh et al. | 257/4 |
| 2012/0294065 | A1 | 11/2012 | Hong et al. | 365/148 |
| 2012/0313071 | A1 | 12/2012 | Gopalan | 257/4 |
| 2012/0319072 | A1 | 12/2012 | Wei et al. | 257/4 |
| 2013/0001501 | A1 | 1/2013 | Sills | 257/4 |
| 2013/0001503 | A1 | 1/2013 | Gallo | 257/4 |
| 2013/0082231 | A1 | 4/2013 | Tada et al. | 257/4 |
| 2013/0112936 | A1 | 5/2013 | Wei et al. | 257/4 |
| 2013/0214234 | A1 | 8/2013 | Gopalan et al. | 257/3 |
| 2013/0252431 | A1 | 9/2013 | Chen et al. | 438/702 |
| 2013/0336046 | A1 | 12/2013 | Oh | 365/163 |
| 2014/0264245 | A1 | 9/2014 | Walls et al. | 257/4 |
| 2015/0236255 | A1 | 8/2015 | Fest et al. | 257/3 |
| 2015/0236258 | A1 | 8/2015 | Fest et al. | 257/3 |
| 2015/0236527 | A1 | 8/2015 | Goldman | 320/1.34 |
| 2016/0190441 | A1 | 6/2016 | Walls et al. | 257/4 |
| 2016/0190442 | A1 | 6/2016 | Fest et al. | 257/4 |
| 2016/0380192 | A1 | 12/2016 | Sato et al. | 257/4 |

FOREIGN PATENT DOCUMENTS

| | | | | |
|---|---|---|---|---|
| CN | 102738386 A | 10/2012 | | H01L 27/24 |
| CN | 103035840 A | 4/2013 | | G11C 13/00 |
| DE | 102007049786 A1 | 4/2009 | | H01L 27/24 |
| EP | 1355365 A2 | 10/2003 | | H01L 27/10 |
| EP | 2202816 A1 | 6/2010 | | H01L 27/24 |
| EP | 2267775 A2 | 12/2010 | | G11C 16/04 |
| EP | 2339585 A1 | 6/2011 | | G11C 16/00 |
| WO | 2010/082922 A1 | 7/2010 | | |
| WO | 2012/057772 A1 | 5/2012 | | H01L 21/8247 |
| WO | 2012/167286 A1 | 12/2012 | | G11C 11/34 |
| WO | 2014/164015 A1 | 10/2014 | | H01L 45/00 |

OTHER PUBLICATIONS

U.S. Final Office Action, U.S. Appl. No. 14/184,034, 16 pages, dated Feb. 10, 2017.
Kozicki, M., "Nanoscale Memory Elements Based on Solid-State Electrolytes," IEEE Transactions on Nano Technology, vol. 4, No. 3, 8 pages, May 2005.
Chen, A., "Non-Volatile Resistive Switching for Advanced Memory Applications," IEDM Technical Digest, 4 pages, 2005.
Balakrishnan, M. et al., "A Low Power Non-Volatile Memory Element Based on Copper in Deposited Silicon Oxide," Non-Volatile Memory Technology Symposium, 7 pages, 2006.
Schindler, C. et al., "Bipolar and Unipolar Resistive Switching in CU-Doped SiO2," IEEE Transactions on Electron Devices, vol. 54, No. 10, 7 pages, 2007.
Chen, A., "Ionic Memories: Status and Challenges," Non-Volatile Memory Technology Symposium, 5 pages, 2008.
Valov, I. et al., "Electrochemical Metallization Memories—Fundamentals, Applications, Prospects," Nanotechnology, vol. 22, No. 25, 22 pages, Jun. 24, 2011.
Jou, S. et al., "Resistance Switching Properties in Cu/Cu—SiO2/TaN Device," Proceeding World Congress on Engineering, vol. 2, 4 pages, Jul. 6, 2011.
Yang, L. et al., "Linear Scaling of Reset Current Down to 22-nm Node for a Novel CuxSiyO RRAM," IEEE Electron Device Letters, vol. 33, No. 1, 3 pages, 2012.
International Search Report and Written Opinion, Application No. PCT/US2014/022194, 11 pages, dated May 16, 2014.
International Search Report and Written Opinion, Application No. PCT/US2014/020188, 10 pages, dated May 13, 2014.
International Search Report and Written Opinion, Application No. PCT/US2014/019868, 10 pages, dated Jun. 5, 2014.
International Search Report and Written Opinion, Application No. PCT/US2014/019906, 12 pages, dated Jul. 2, 2014.
International Search Report and Written Opinion, Application No. PCT/US2015/016268, 9 pages, dated May 4, 2015.
International Search Report and Written Opinion, Application No. PCT/US2015/016244, 11 pages, dated May 7, 2015.
International Search Report and Written Opinion, Application No. PCT/US2015/016259, 16 pages, dated May 6, 2015.
International Search Report and Written Opinion, Application No. PCT/US2015/016321, 11 pages, dated Jul. 14, 2015.
U.S. Non-Final Office Action, U.S. Appl. No. 14/183,792, 23 pages, dated Jul. 8, 2015.
U.S. Non-Final Office Action, U.S. Appl. No. 14/183,831, 18 pages, dated Jul. 9, 2015.
U.S. Non-Final Office Action, U.S. Appl. No. 14/183,674, 26 pages, dated Jul. 8, 2015.
U.S. Non-Final Office Action, U.S. Appl. No. 14/184,177, 12 pages, dated Jun. 19, 2015.
U.S. Non-Final Office Action, U.S. Appl. No. 14/183,738, 26 pages, dated Jul. 16, 2015.
U.S. Non-Final Office Action, U.S. Appl. No. 14/183,953, 27 pages, dated Jul. 31, 2015.
U.S. Final Office Action, U.S. Appl. No. 14/184,331, 10 pages, dated Nov. 12, 2015.
U.S. Final Office Action, U.S. Appl. No. 14/184,034, 29 pages, dated Dec. 16, 2015.
International Search Report and Written Opinion, Application No. PCT/US2015/016334, 11 pages, dated Dec. 7, 2015.
U.S. Final Office Action, U.S. Appl. No. 14/183,831, 13 pages, dated Feb. 2, 2016.
International Search Report and Written Opinion, Application No. PCT/US2015/062758, 12 pages, dated Mar. 2, 2016.

(56) References Cited

OTHER PUBLICATIONS

U.S. Non-Final Office Action, U.S. Appl. No. 14/184,034, 23 pages, dated Jun. 16, 2017.
Taiwan Office Action, Application No. 103108885, 15 pages, dated Jun. 6, 2017.
U.S. Non-Final Office Action, U.S. Appl. No. 15/065,193, 33 pages, dated Jul. 14, 2017.
Chinese Office Action, Application No. 201480011426.5, 9 pages, dated Apr. 1, 2017.
Chinese Office Action, Application No. 201480011450.9, 5 pages, dated Apr. 14, 2017.
Chinese Office Action, Application No. 201480011221.7, 8 pages, dated Apr. 17, 2017.
Taiwan Office Action, Application No. 103108782, 3 pages, dated May 12, 2017.
U.S. Non-Final Office Action, U.S. Appl. No. 14/952,559, 30 pages, dated Mar. 1, 2017.
U.S. Non-Final Office Action, U.S. Appl. No. 15/200,322, 16 pages, dated Mar. 1, 2017.
Taiwan Office Action, Application No. 103108883, 5 pages, dated Jul. 31, 2017.
U.S. Non-Final Office Action, U.S. Appl. No. 15/262,923, 33 pages, dated Aug. 10, 2017.
U.S. Notice of Allowance, U.S. Appl. No. 15/200,322, 27 pages, dated Oct. 4, 2017.
U.S. Final Office Action, U.S. Appl. No. 15/262,923, 17 pages, dated Dec. 26, 2017.
U.S. Final Office Action, U.S. Appl. No. 14/184,034, 22 pages, dated Jan. 3, 2018.
European Office Action, Application No. 15707029.3, 8 pages, dated Jan. 8, 2018.
U.S. Final Office Action, U.S. Appl. No. 15/065,193, 19 pages, dated Jan. 11, 2018.
European Office Action, Application No. 15707484.0, 4 pages, dated Jan. 11, 2018.

RESISTIVE MEMORY CELL HAVING A REDUCED CONDUCTIVE PATH AREA

CROSS-REFERENCE TO RELATED APPLICATIONS

This application is a divisional of U.S. application Ser. No. 14/184,268 filed on Feb. 19, 2014, which is incorporated herein in its entirety.

TECHNICAL FIELD

The present disclosure relates to resistive memory cells, e.g., conductive bridging random access memory (CBRAM) or resistive random-access memory (ReRAM) cells, having a reduced area for the formation of conductive paths (e.g., conductive filaments or vacancy chains).

BACKGROUND

Resistive memory cells, such as conductive bridging memory (CBRAM) and resistive RAM (ReRAM) cells are a new type of non-volatile memory cells that provide scaling and cost advantages over conventional Flash memory cells. A CBRAM is based on the physical re-location of ions within a solid electrolyte. A CBRAM memory call can be made of two solid metal electrodes, one relatively inert (e.g., tungsten) the other electrochemically active (e.g., silver or copper), with a thin film of the electrolyte between them. The fundamental idea of a CBRAM cell is to create programmable conducting filaments, formed by either single or very few nanometer-scale ions across a normally non-conducting film through the application of a bias voltage across the non-conducting film. The non-conducting film is referred to as the electrolyte since it creates the filament through an oxidation/reduction process much like in a battery. In a ReRAM cell the conduction is through creation of a vacancy chain in an insulator. The creation of the filament/vacancy-chain creates an on-state (high conduction between the electrodes), while the dissolution of the filament/vacancy-chain is by applying a similar polarity with Joule heating current or an opposite polarity but at smaller currents to revert the electrolyte/insulator back to its non-conductive off-state.

A wide range of materials have been demonstrated for possible use in resistive memory cells, both for the electrolyte and the electrodes. One example is the Cu/SiOx based cell in which the Cu is the active metal-source electrode and the SiOx is the electrolyte.

One common problem facing resistive memory cells is the on-state retention, i.e., the ability of the conductive path (filament or vacancy chain) to be stable, especially at the elevated temperatures that the memory parts would typically be qualified to (85 C/125 C).

Figure 1:
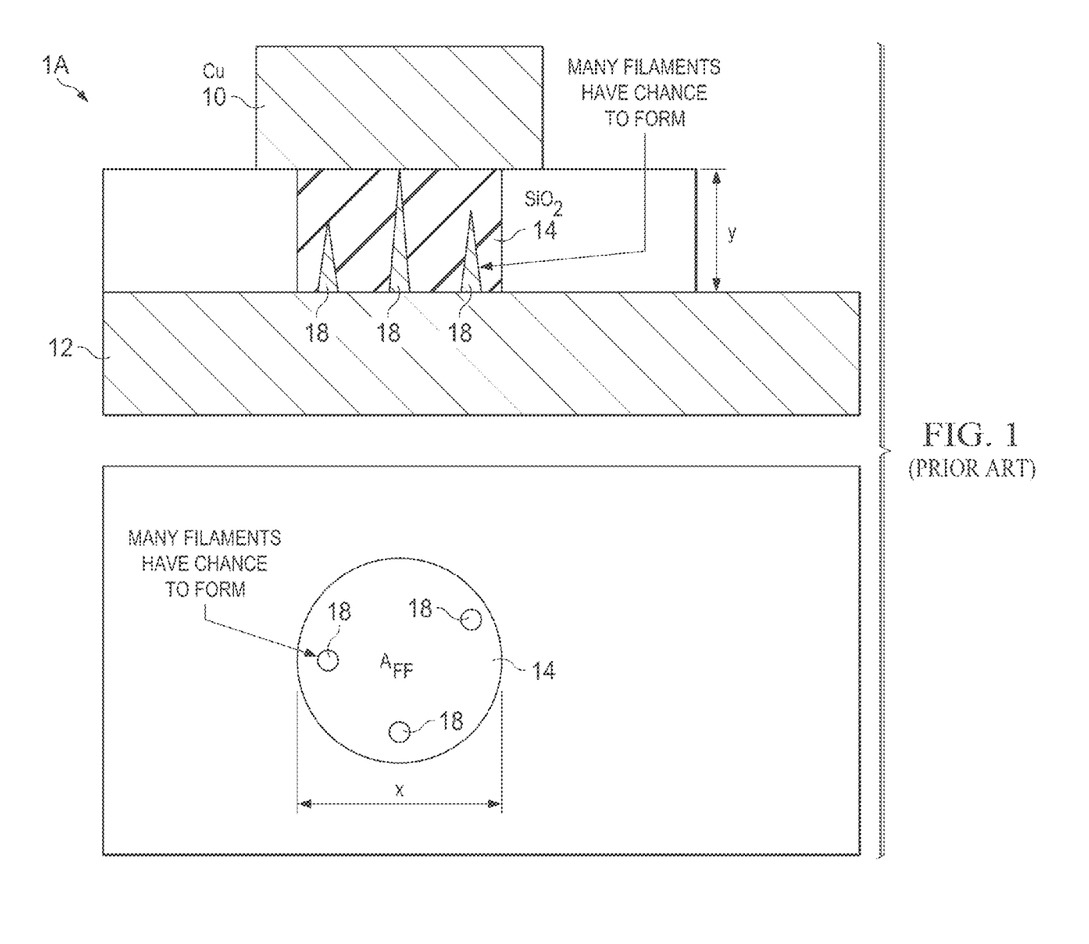
FIG. 1 shows an example conventional CBRAM cell.

FIG. 1 shows a conventional CBRAM cell 1A, having a top electrode 10 (e.g., copper) arranged over a bottom electrode 12 (e.g., tungsten), with the electrolyte or middle electrode 14 (e.g., $SiO_2$) arranged between the top and bottom electrodes. Conductive filaments 18 propagate from the bottom electrode 12 to the top electrode 10 through the electrolyte 14 when a bias voltage is applied to the cell 1A. This structure has various potential limitations or drawbacks. For example, the effective cross-sectional area for filament formation, referred to herein as the effective filament formation area indicated as $A_{FF}$, or alternatively the "confinement zone," is relatively large and unconfined, making the filament formation area susceptible to extrinsic defects. Also, multi-filament root formation may be likely, due to a relatively large area, which may lead to weaker (less robust) filaments. In general, the larger the ratio between the diameter or width of the effective filament formation area $A_{FF}$ (indicated by "x") to the filament propagation distance from the bottom electrode 12 to the top electrode 10 (in this case, the thickness of the electrolyte 14, indicated by "y"), the greater the chance of multi-root filament formation. Further, a large electrolyte volume surrounds the filament, which provides diffusion paths for the filament and thus may provide poor retention. Thus, restricting the volume of the electrolyte material in which the conductive path forms may provide a more robust filament due to spatial confinement. The volume of the electrolyte material in which the conductive path forms may be restricted by reducing the area in contact between the bottom electrode 12 and the electrolyte 14.

As used herein, "conductive path" refers a conductive filament (e.g., in a CBRAM cell), vacancy chain (e.g., in an oxygen vacancy based ReRAM cell), or any other type of conductive path for connecting the bottom and top electrodes of a non-volatile memory cell (typically through an electrolyte layer or region arranged between the bottom and top electrodes). As used herein the "electrolyte layer" or "electrolyte region" refers to an electrolyte/insulator/memory layer or region between the bottom and top electrodes through which the conductive path propagates.

Figure 2:
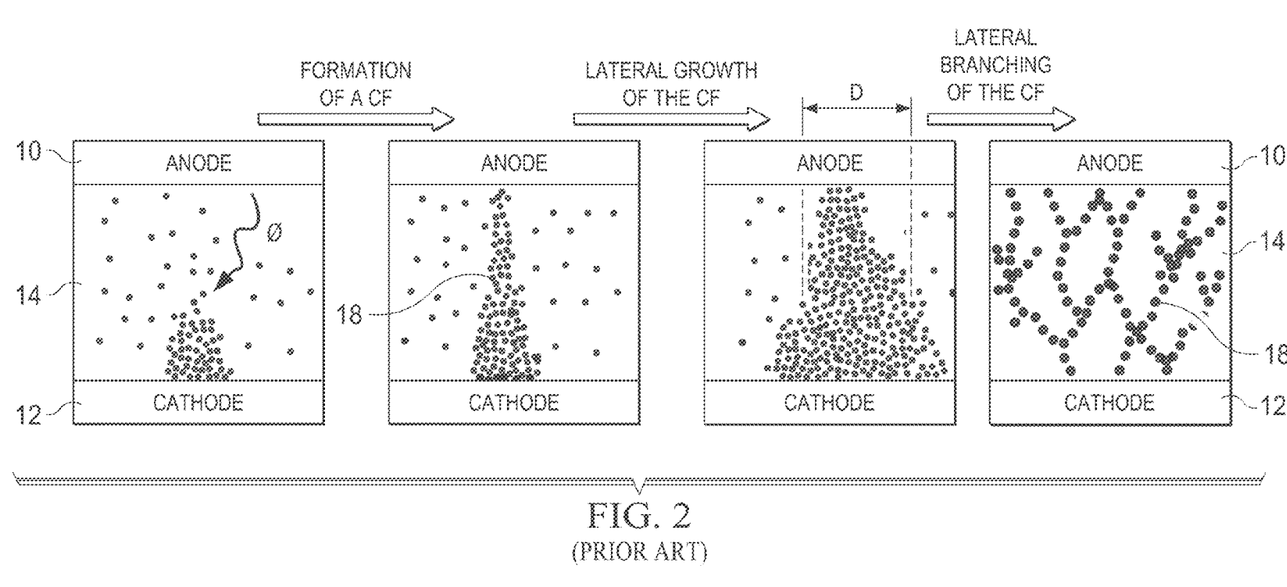
FIG. 2 shows certain principles of CBRAM cell formation.

FIG. 2 shows certain principles of a CBRAM cell formation. Conductive paths 18 may form and grow laterally, or branch into multiple parallel paths. Further, locations of the conductive paths may change with each program/erase cycle. This may contribute to a marginal switching performance, variability, high-temp retention issues, and/or switching endurance. Restricting switching volume has been shown to benefit the operation. These principles apply to ReRAM and CBRAM cells. A key obstacle for adoption of these technologies is switching uniformity.

Figure 3A:
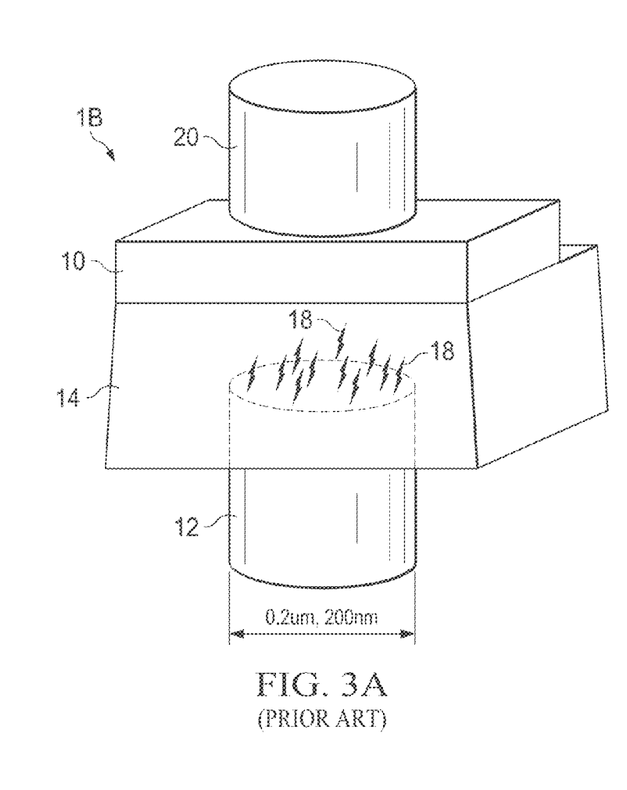
FIGS. 3A and 3B show a schematic view and an electron microscope image of an example known CBRAM cell configuration.
Figure 3B:
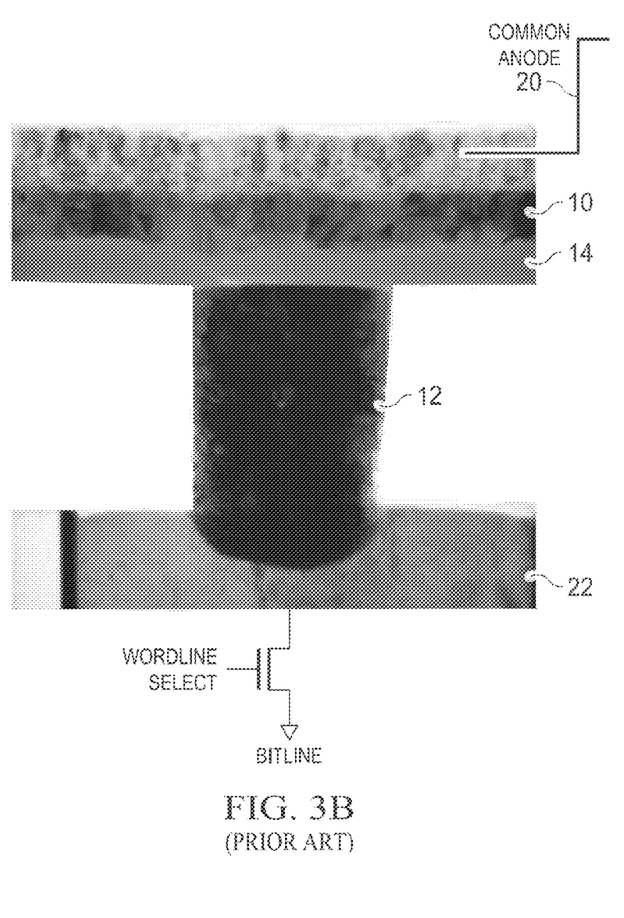

FIGS. 3A and 3B show a schematic view and an electron microscope image of an example known bottom electrode configuration 1B for a CBRAM cell (e.g., having a one-transistor, one-resistive memory element (1T1R) architecture). In this example, the bottom electrode 12 is a cylindrical via, e.g., a tungsten-filled via with a Ti/TiN liner. The bottom electrode 12 may provide a relatively large effective filament formation area $A_{FF}$, or confinement zone, of about 30,000 $nm^2$, for example, which may lead to one or more of the problems or disadvantages discussed above.

SUMMARY

Some embodiments provide resistive memory cells, e.g., CBRAM or ReRAM cells, that focus the electric field more precisely than in known cells, which may provide more consistent filament formation, thus improving the consistency of programming voltage and cell predictability. For example, some embodiments provide techniques for achieving a highly focused electric field emanating from the bottom electrode of the cell. In some embodiments, the effective cross-sectional area, or "confinement zone," of the bottom electrode may be reduced in comparison to known resistive memory cells. For example, the confinement zone may be reduced to less than 1,000 $nm^2$, less than 100 $nm^2$, less than 10 $nm^2$, or even less than 1 $nm^2$.

According to one embodiment, a method of forming a resistive memory cell, e.g., a CBRAM or ReRAM, may include forming a bottom electrode layer, oxidizing an exposed region of the bottom electrode layer to form an oxide region, removing a region of the bottom electrode layer proximate the oxide region, thereby forming a bottom electrode having a pointed tip region adjacent the oxide region, and forming an electrolyte region and top electrode over at least a portion of the bottom electrode and oxide region, such that the electrolyte region is arranged between the pointed tip region of the bottom electrode and the top electrode, and provides a path for conductive filament or vacancy chain formation from the pointed tip region of the bottom electrode to the top electrode when a voltage bias is applied to the memory cell According to another embodiment, a method of forming an array of cells, e.g., CBRAM or ReRAM cells, may include: forming a bottom electrode layer on a substrate; oxidizing a plurality of exposed regions of the bottom electrode layer to form a plurality of oxide regions spaced apart from each other; removing regions of the bottom electrode layer between adjacent oxide regions, thereby forming a plurality of bottom electrodes, each bottom electrode having a respective oxide region at an upper side of the bottom electrode and at least one pointed tip region adjacent the respective oxide region; forming an electrolyte layer and a top electrode layer over the plurality of bottom electrodes and respective oxide regions; and removing portions of the electrolyte layer and a top electrode layer to form an electrolyte region and a top electrode on each bottom electrode and respective oxide region, thereby forming an array of cells, each cell including a respective bottom electrode, a respective oxide region, a respective electrolyte region, and a respective top electrode; wherein, for each cell, the respective electrolyte region is arranged between the pointed tip region of the respective bottom electrode and the respective top electrode, thereby providing a path for the formation of at least one conductive filament or vacancy chain from the pointed tip region of the respective bottom electrode to the respective top electrode through the respective electrolyte region.

BRIEF DESCRIPTION OF THE FIGURES

Example embodiments are discussed below with reference to the drawings, in which.

DETAILED DESCRIPTION

Figure 4A:
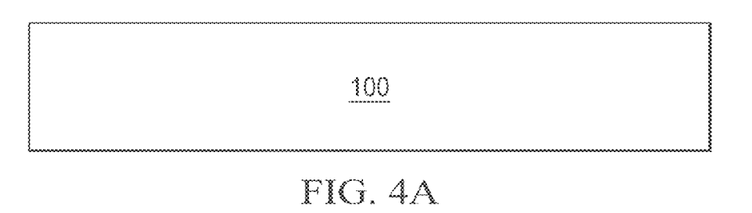
FIGS. 4A-4K illustrate an example method for forming an array of resistive memory cells, e.g., CBRAM or ReRAM cells, according to one embodiment of the present invention.
Figure 4B:
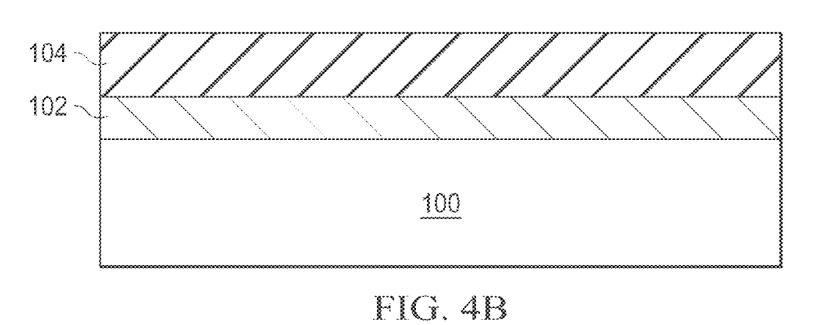

FIGS. 4A-4K illustrate an example method for forming an array of resistive memory cells, e.g., an array of conductive bridging memory (CBRAM) and resistive RAM (ReRAM) cells, according to one embodiment. As shown in FIG. 4A, a dielectric substrate 100 (e.g., SiO$_2$) is formed, using any suitable technique. Next, as shown in FIG. 4B, a bottom electrode layer 102 and a hard mask layer 104 are deposited or formed over the dielectric substrate 100. Bottom electrode layer 102 may comprise any suitable conductive material or materials, e.g., polysilicon, doped polysilicon, amorphous silicon, doped amorphous silicon, or any other suitable material, and may be deposited or formed in any suitable manner. Hard mask layer 104 may be formed from any suitable materials (e.g., silicon nitride) and may be deposited or formed in any suitable manner as known in the art.

Figure 4C:
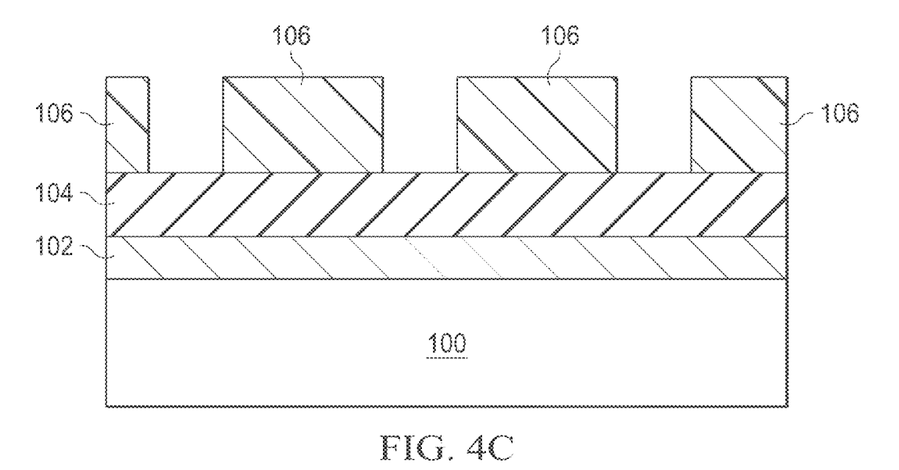

Next, as shown in FIG. 4C, the hard mask layer 104 is patterned, e.g., by forming and patterning a photoresist layer 106 over the hard mask layer 104, using any suitable photolithography techniques. As shown, certain areas of the hard mask layer 104 are exposed through the patterned photoresist layer 106. Next, as shown in FIG. 4D, an etching process is performed to remove the photoresist layer 106 and portions of the hard mask layer 104 corresponding to the exposed areas shown in FIG. 4C, thereby forming a patterned hard mask 104A having an array of openings 105.

Figure 4D:
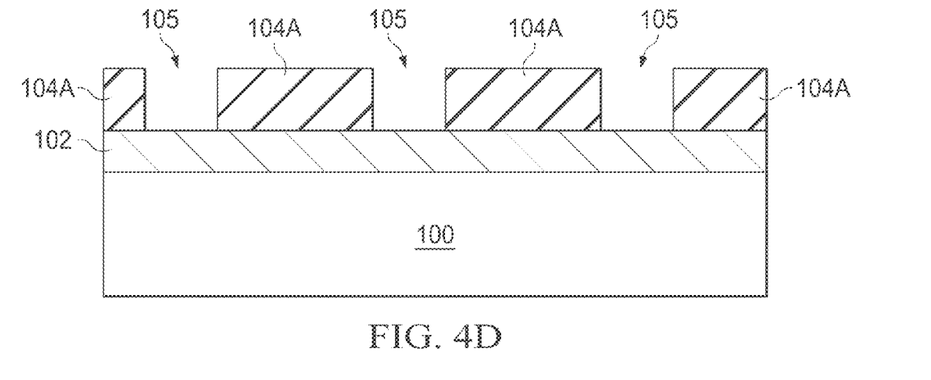

The patterning and etching processes of FIGS. 4C and 4D may be selected such that openings 105 have any desired size and shape. For example, openings 105 may have a circular or oval shaped cross-section (in a plane parallel to the bottom electrode layer 102), thus providing cylindrical or elongated cylindrical openings 105. As another example, openings 105 may have a rectangular or otherwise elongated cross-section (in a plane parallel to the bottom electrode layer 102), thus providing elongated trench-style openings 105. Openings 105 may have any other suitable shapes and sizes.

Figure 4E:
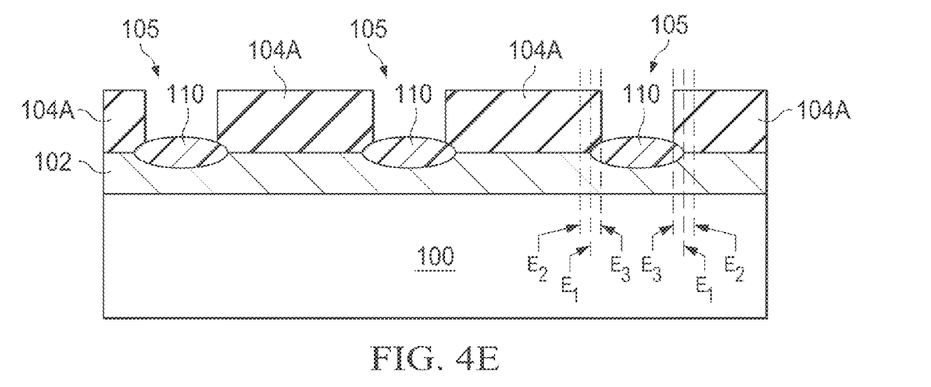

Next, as shown in FIG. 4E, an oxidation process is performed to oxidize areas of the bottom electrode layer 102 that are exposed through the openings 105 in patterned hard mask 104A, thereby forming a number of spaced-apart oxide regions 110. In some embodiments, each oxide region 110 may have a generally oval, rounded, curved, or otherwise non-orthogonal shape in a cross-section extending perpendicular to the bottom electrode layer 102 (i.e., the cross-section shown in FIG. 4E).

Figure 4F:
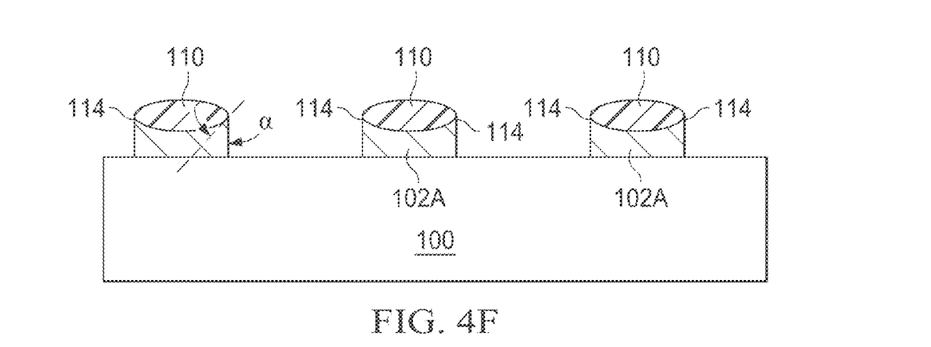

Next, as shown in FIG. 4F, the hard mask 104A is removed and the remaining bottom electrode layer 102 and oxide regions 110 are etched to form an array of spaced-apart bottom electrodes 102A and corresponding oxide regions 110. Alternatively, the hard mask 104A may be removed during the etching of the bottom electrodes 102A. The bottom electrode layer 102 and oxide regions 110 may be etched in any suitable manner, e.g., by applying and utilizing a patterned mask or photoresist above the stack, or by using the oxide regions 110 themselves as a mask (e.g., using an etch selective to the non-oxidized bottom electrode material). The etch may or may not be patterned to follow the pattern defined by openings 105 (and thus the pattern of oxide regions 110). Thus, bottom electrodes 102A may have any shape and size, which may or may not correspond with the shapes and sizes of the openings 105 and oxide regions 110 prior to the etch process. For example, bottom electrodes 102A may have a cylindrical or elongated cylindrical shape having a circular or oval shaped perimeter, or an rectangular prism shape have an elongated rectangular perimeter.

In addition, the lateral edges of the etch may be selected with respect to the lateral or outer perimeter edge or extent of each oxide region 110. For example, with reference to FIG. 4E, the lateral edges of the etch may align with the outer perimeter edge of each oxide region 110, as indicated by dashed lines $E_1$. Alternatively, the lateral edges of the etch may be aligned outside the outer perimeter edge of each oxide region 110, as indicated by dashed lines $E_2$, such that the post-etch bottom electrode 102A has a region laterally outside the outer perimeter edge of the oxide region 110. Alternatively, the lateral edges of the etch may be aligned inside the outer perimeter edge of each oxide region 110, as indicated by dashed lines $E_3$, such that the etch extends removes an outer portion of the oxide region 110.

Returning to FIG. 4F, each bottom electrode 102A has a pointed tip region 114 adjacent the respective oxide region. The shape of the pointed tip region 114 may be at least partially defined by the oxide region 110. For example, where the vertical cross-section of the oxide region 110 is oval shaped or otherwise curves downwardly toward the substrate 100, the curved area toward the lateral perimeter of the oxide region 110 helps define the shape of the pointed tip region 114 of the bottom electrode 102A. Thus, in the vertical plane, the pointed tip region 114 may define an angle α of less than 90 degrees, as shown in FIG. 4F.

The pointed tip region 114 may extend partially or fully around the lateral perimeter of the bottom electrode 102A (e.g., a circular, oval, or rectangular perimeter). In some embodiments, the lateral perimeter of the bottom electrode 102A defines a plurality of sides (e.g., a rectangular perimeter defining four sides), and the pointed tip region 114 extends along one, two, three, or more of the perimeter sides.

Figure 4G:
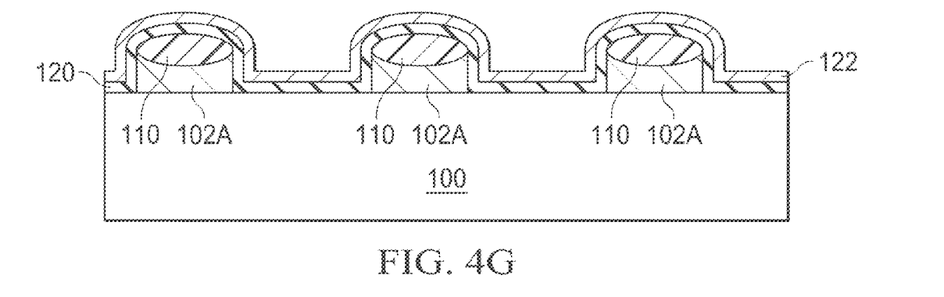

Next, as shown in FIG. 4G, an electrolyte layer 120 and a top electrode layer 122 are formed over the array of bottom electrode 102A and corresponding oxide regions 110. Electrolyte layer 120 may comprise any suitable dielectric or memristive type material or materials, for example, $SiO_x$ (e.g., $SiO_2$), GeS, CuS, $TaO_x$, $TiO_2$, $Ge_2Sb_2Te_5$, GdO, HfO, CuO, $Al_2O_3$, or any other suitable material. Top electrode layer 122 may comprise any suitable conductive material or materials, e.g., Ag, Al, Cu, Ta, TaN, Ti, TiN, Al, W or any other suitable material, and may be deposited or formed in any suitable manner.

Figure 4H:
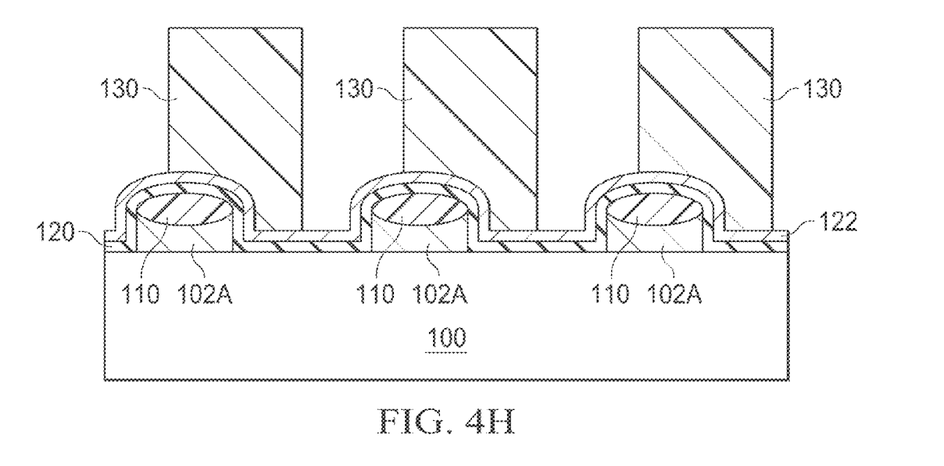

Next, as shown in FIG. 4H, the stack is patterned, e.g., by forming and patterning a photomask 130 over the top electrode layer 122, using any suitable photolithography techniques. As shown, certain areas of the top electrode layer 122 are exposed through the patterned photomask 130. In the illustrated embodiment, the patterned photoresist layer 130 covers only a portion of each underlying bottom electrode 102A/oxide region 110.

Figure 4I:
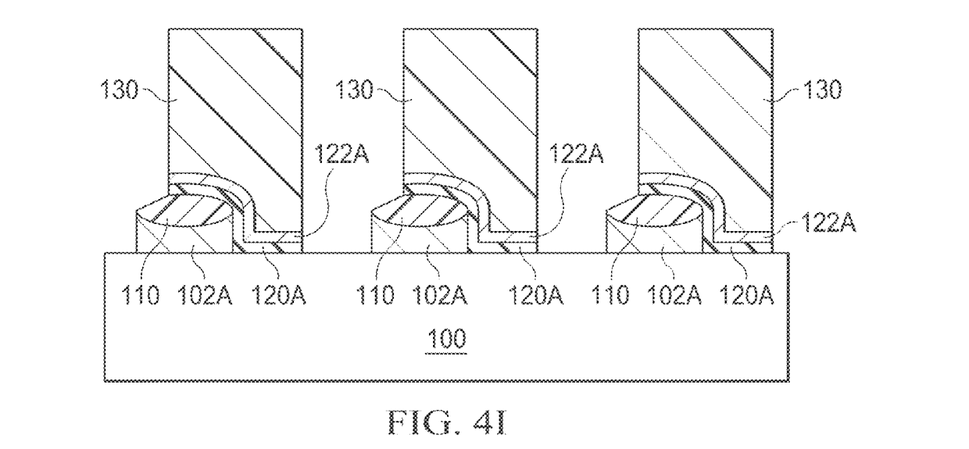

Next, as shown in FIG. 4I, an etching process is performed to remove exposed portions of the top electrode layer 122 and electrolyte layer 120. In some embodiments, the etch may be selective with respect to the oxide region 110 such that the oxide region 110 and underlying bottom electrode 102A are not removed, while exposing surfaces of the oxide region 110 and bottom electrode 102A. As shown, the remaining portions of the top electrode layer 122 and electrolyte layer 120 define a respective top electrode 122A and electrolyte region 120A for each bottom electrode 102A/oxide region 110 structure.

Figure 4J:
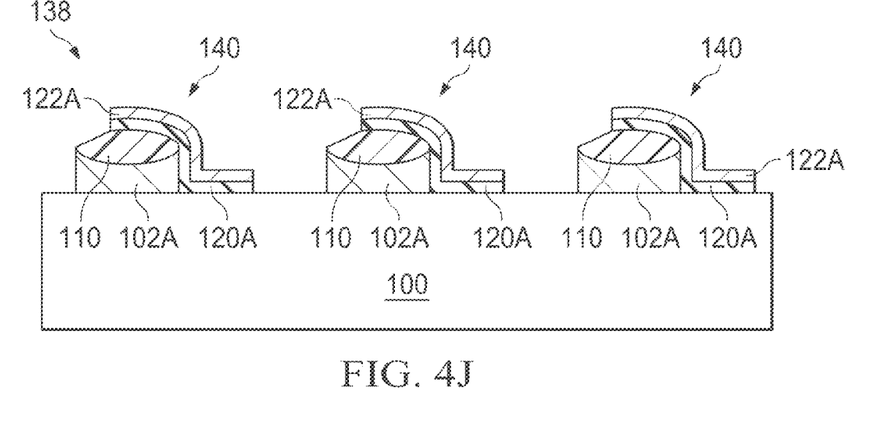
Figure 4K:
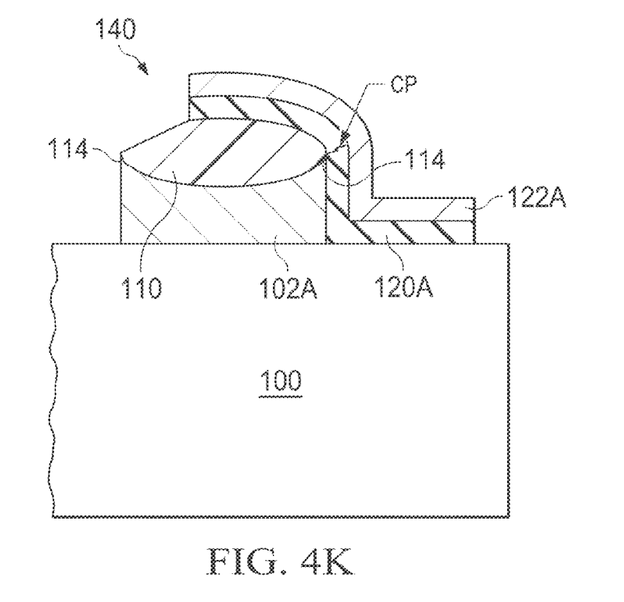

Next, as shown in FIG. 4J, any remaining portions of the photomask 130 may be removed, leaving an array 138 of resistive memory cells 140. Each cell 140 includes a bottom electrode 102A having an oxide region 110 at an upper surface, a top electrode 122A, and an electrolyte region 120A arranged between the bottom electrode 102A and top electrode 122A. A close-up of one cell 140 is shown in FIG. 4K. As shown, the electrolyte region 120A is arranged between the pointed tip region 114 of the bottom electrode 102A and the top electrode 122A, which provides a conductive path for the formation of conductive filament(s) or vacancy chain(s) from the pointed tip region 114 of the bottom electrode 102A to the top electrode 122A through the electrolyte region 120A, said conductive path indicated by the illustrated dashed arrow CP.

The structure of cells 140, including the pointed tip region 114, may provide a relatively small, or confined, effective filament formation area $A_{FF}$, or confinement zone. For example, the effective filament formation area $A_{FF}$, measured in a plane generally perpendicular to the direction of filament propagation, may be less than 1,000 nm$^2$. In some embodiments, the effective filament formation area $A_{FF}$ is less than 100 nm$^2$. In particular embodiments, the effective filament formation area $A_{FF}$ is less than 10 nm$^2$, or even less than 1 nm$^2$. This reduced confinement zone may provide resistive memory cells (e.g., CBRAM or ReRAM cells) with more predictable and reliable filament formation, as compared with cells having a larger confinement zone. This may provide one or more of the following benefits: lower erase current, narrower distribution of low-resistance state (LRS), higher on/off ratio (HRS/LRS), and improved failure rates.

Figure 5A:
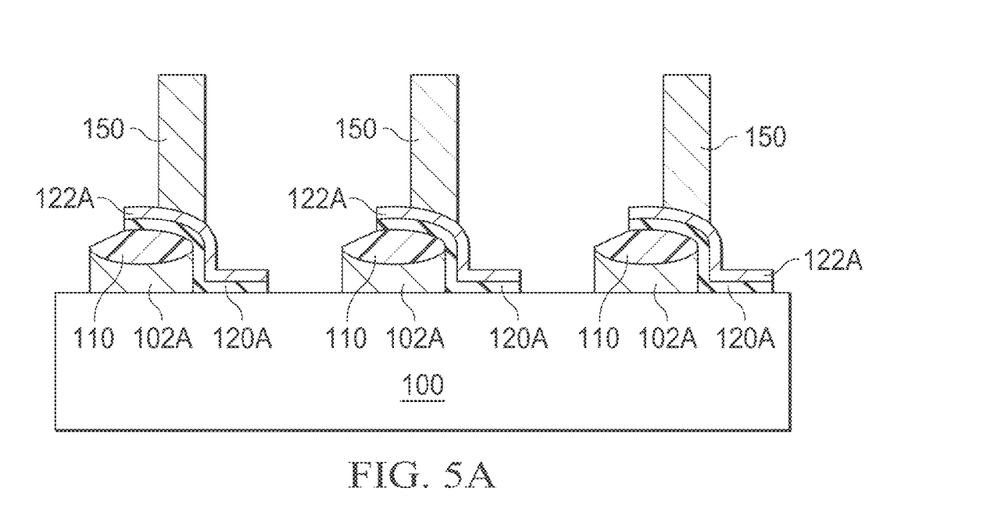
FIG. 5A illustrates a first example top electrode contact configuration, according to one embodiment.
Figure 5B:
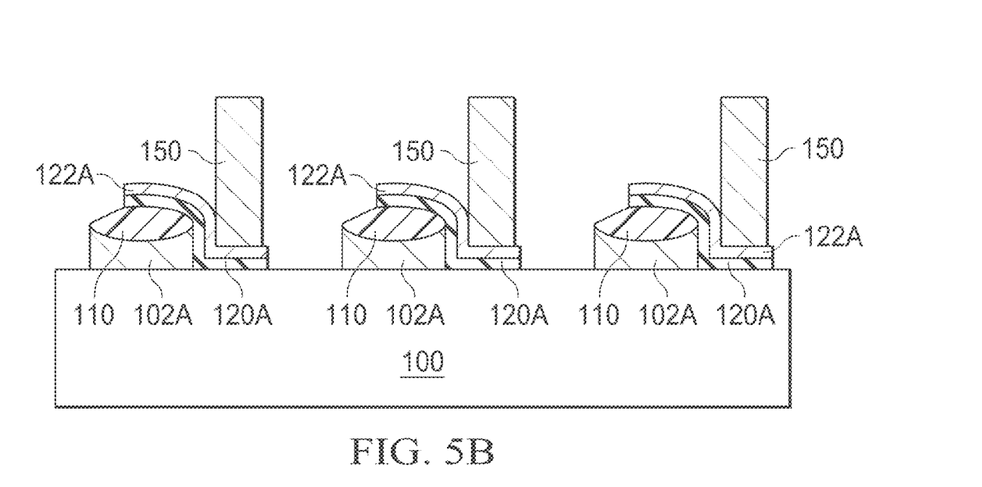
FIG. 5B illustrates a second example top electrode contact configuration, according to another embodiment.

Top electrodes 122A may be connected in or to any suitable circuitry using any suitable contact scheme. For example, FIGS. 5A and 5B illustrate two example schemes for contacting top electrodes 122A. First, as shown in FIG. 5A, top contacts 150 may be formed such that they contact an upper portion of each top electrode 122A, above the respective bottom electrode 102A/oxide region 110. Second, as shown in FIG. 5B, top contacts 150 may be formed such that they contact a lower portion of each top electrode 122A at a location lateral to the respective bottom electrode 102A/oxide region 110. Top contacts 150 may be arranged in any other suitable manner with respect to top electrodes 122A and other cell components.

In addition, it should be understood that each bottom electrode 102A may be contacted (e.g., for connection to a wordline or bitline) in any suitable or conventional manner. For example, each bottom electrode 102A may be contacted from above by dropping down a contact that is recessed or offset from the memory films. As another example, each bottom electrode 102A may be contacted from below by depositing the bottom electrode layer 102 directly on a salicided active silicon region and then making contact to the active region at the end of a line of bits.

Although the disclosed embodiments are described in detail in the present disclosure, it should be understood that various changes, substitutions and alterations can be made to the embodiments without departing from their spirit and scope.

The invention claimed is:

1. An array of resistive memory cells, each cell comprising:
   a bottom electrode formed on a substrate;
   an oxide region formed on top of the bottom electrode and covering the bottom electrode; wherein the bottom electrode has a pointed tip region proximate the oxide region, wherein the tip is formed at an edge of the bottom electrode and extends in a substantially vertical direction with respect to the substrate;
   a top electrode; and
   an electrolyte region extending from a top surface of the substrate to a top surface of said oxide region thereby being arranged between the top electrode and the pointed tip region of the bottom electrode, the electrolyte region providing a path for the formation of a conductive filament or vacancy chain from the pointed tip region of the bottom electrode to the top electrode when a voltage bias is applied to the cell.

2. The cell array according to claim 1, wherein a cross-section of the oxide region in a plane perpendicular to the bottom electrode layer has a generally oval shape.

3. The cell array according to claim 1, wherein a shape of the pointed tip region of the bottom electrode is defined by the oxide region.

4. The cell array according to claim 1, wherein the pointed tip region of the bottom electrode extends around a perimeter of the bottom electrode.

5. The cell array according to claim 1, wherein:
the bottom electrode layer defines an elongated edge at a top side of the bottom electrode; and
the pointed tip region of the bottom electrode extends along the elongated edge of the bottom electrode layer.

6. The cell array according to claim 1, wherein each cell is a conductive bridging memory (CBRAM) cell.

7. The cell array according to claim 1, wherein each cell is a resistive RANI (ReRAM) cell.

8. An array of resistive memory cells, each cell comprising:
a bottom electrode formed on a substrate within a bottom electrode layer, wherein the bottom electrode forms a column;
an oxide region formed on top of the bottom electrode and extending laterally from a first lateral side to a second lateral side of a top surface of the bottom electrode thereby covering the entire top surface of the bottom electrode, wherein the oxide region has a non-orthogonal shape in a cross section extending perpendicular to the bottom electrode layer such that the bottom electrode has a pointed tip region adjacent the first lateral side of the oxide region and having a shape defined in part by a shape of the first lateral side of the oxide region;
a top electrode; and
an electrolyte region between the top electrode and the pointed tip region of the bottom electrode, the electrolyte region providing a path for the formation of a conductive filament or vacancy chain from the pointed tip region of the bottom electrode to the top electrode when a voltage bias is applied to the cell.

9. The cell array according to claim 8, wherein a cross-section of the oxide region in a plane perpendicular to the bottom electrode layer has a generally oval shape.

10. The cell array according to claim 8, wherein a shape of the pointed tip region of the bottom electrode is defined by the oxide region.

11. The cell array according to claim 8, wherein the pointed tip region of the bottom electrode extends around a perimeter of the bottom electrode.

12. The cell array according to claim 8, wherein:
the bottom electrode layer defines an elongated edge at a top side of the bottom electrode; and
the pointed tip region of the bottom electrode extends along the elongated edge of the bottom electrode layer.

13. The cell array according to claim 8, wherein each cell is a conductive bridging memory (CBRAM) cell.

14. The cell array according to claim 8, wherein each cell is a resistive RAM (ReRAM) cell.

15. An array of resistive memory cells, each cell comprising:
a bottom electrode formed on a substrate within a bottom electrode layer, wherein the bottom electrode forms a column;
an oxide region extending from a top surface of the bottom electrode and from a first lateral side to a second lateral side of the top surface covering a surface of the column;
wherein the top surface of the bottom electrode is concave thereby providing a pointed tip region adjacent the first lateral side of the oxide region at an edge of the column;
a top electrode; and
an electrolyte region between the top electrode and the pointed tip region of the bottom electrode, the electrolyte region providing a path for the formation of a conductive filament or vacancy chain from the pointed tip region of the bottom electrode to the top electrode when a voltage bias is applied to the cell.

16. The cell array according to claim 15, wherein a cross-section of the oxide region in a plane perpendicular to the bottom electrode layer has a generally oval shape.

17. The cell array according to claim 15, wherein a shape of the pointed tip region of the bottom electrode is defined by the oxide region.

18. The cell array according to claim 15, wherein the pointed tip region of the bottom electrode extends around a perimeter of the bottom electrode.

19. The cell array according to claim 15, wherein:
the bottom electrode layer defines an elongated edge at a top side of the bottom electrode; and
the pointed tip region of the bottom electrode extends along the elongated edge of the bottom electrode layer.

20. The cell array according to claim 15, wherein each cell is a conductive bridging memory (CBRAM) cell.

21. The cell array according to claim 15, wherein each cell is a resistive RAM (ReRAM) cell.

22. The cell array according to claim 15, wherein a footprint of the column has an oval shape.

23. The cell array according to claim 15, wherein a footprint of the column has a circular shape.

24. The cell array according to claim 15, wherein a footprint of the column has a rectangular shape.

\* \* \* \* \*

UNITED STATES PATENT AND TRADEMARK OFFICE
CERTIFICATE OF CORRECTION

PATENT NO. : 9,917,251 B2
APPLICATION NO. : 15/065354
DATED : March 13, 2018
INVENTOR(S) : Paul Fest et al.

Page 1 of 1

It is certified that error appears in the above-identified patent and that said Letters Patent is hereby corrected as shown below:

In the Claims

Column 7,
Claim 7, Line 18, "…is a resistive RANI (ReRAM) cell." ---Change to--- "…is a resistive RAM (ReRAM) cell."

Signed and Sealed this
Twenty-sixth Day of June, 2018

Andrei Iancu
*Director of the United States Patent and Trademark Office*